United States Patent
Hong (10) Patent No.: US 10,102,059 B2
(45) Date of Patent: Oct. 16, 2018

(54) DATA STORAGE DEVICE CAPABLE OF PREVENTING A DATA RETENTION FAIL OF A NONVOLATILE MEMORY DEVICE AND OPERATING METHOD THEREOF

(71) Applicant: SK hynix Inc., Gyeonggi-do (KR)

(72) Inventor: Ji Man Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 170 days.

(21) Appl. No.: 15/146,575

(22) Filed: May 4, 2016

(65) Prior Publication Data

US 2017/0091039 A1    Mar. 30, 2017

(30) Foreign Application Priority Data

Sep. 25, 2015 (KR) .................. 10-2015-0136355

(51) Int. Cl.
| | |
|---|---|
| G06F 11/10 | (2006.01) |
| G11C 16/34 | (2006.01) |
| G11C 11/56 | (2006.01) |
| G11C 29/02 | (2006.01) |
| G11C 16/26 | (2006.01) |
| G06F 11/14 | (2006.01) |
| G11C 16/10 | (2006.01) |
| G11C 29/42 | (2006.01) |

(52) U.S. Cl.
CPC ........ *G06F 11/106* (2013.01); *G06F 11/1048* (2013.01); *G06F 11/1056* (2013.01); *G11C 11/5642* (2013.01); *G11C 16/26* (2013.01); *G11C 16/3431* (2013.01); *G11C 29/021* (2013.01); *G11C 29/028* (2013.01); *G06F 11/142* (2013.01); *G06F 2201/805* (2013.01); *G06F 2201/85* (2013.01); *G11C 16/10* (2013.01); *G11C 16/3495* (2013.01); *G11C 29/42* (2013.01)

(58) Field of Classification Search
CPC . G11C 16/34–16/3486; G11C 11/5642; G11C 16/10; G11C 16/26; G11C 16/3431; G11C 29/021; G11C 29/028; G06F 11/1048; G06F 11/1056; G06F 11/106; G06F 11/142

See application file for complete search history.

(56) References Cited

U.S. PATENT DOCUMENTS

| | | | | |
|---|---|---|---|---|
| 7,477,547 | B2 * | 1/2009 | Lin ................. | G06F 11/106 |
| | | | | 365/185.09 |
| 8,254,170 | B2 * | 8/2012 | Eli ................. | G11C 16/3418 |
| | | | | 365/185.09 |
| 8,689,082 | B2 * | 4/2014 | Oh ................. | G11C 11/5628 |
| | | | | 714/764 |

(Continued)

FOREIGN PATENT DOCUMENTS

KR     101406279     6/2014

*Primary Examiner* — Paul Contino
(74) *Attorney, Agent, or Firm* — IP & T GROUP LLP (57) ABSTRACT

A method for operating a data storage device including a plurality of pages includes performing a read operation to a first page of the nonvolatile memory device according to a read voltage; adjusting the read voltage based on a number of error bits in the read-out data according to the read voltage; performing the read operation to the first page according to the adjusted read voltage; and performing a re-program operation to the first page based on a number of on cells as a result of the read operation according to the adjusted read voltage.

16 Claims, 10 Drawing Sheets

(56) References Cited

U.S. PATENT DOCUMENTS

| | | | | |
|---|---|---|---|---|
| 2009/0292972 | A1* | 11/2009 | Seol | G11C 16/26 714/763 |
| 2010/0107160 | A1* | 4/2010 | Srinivasan | G06F 21/57 718/1 |
| 2010/0199020 | A1* | 8/2010 | Lin | G06F 12/0246 711/103 |
| 2011/0035536 | A1* | 2/2011 | Shim | G06F 12/0246 711/103 |
| 2011/0085379 | A1* | 4/2011 | Kim | G11C 11/5628 365/185.03 |
| 2012/0254699 | A1* | 10/2012 | Ruby | G06F 11/1048 714/773 |
| 2012/0265927 | A1* | 10/2012 | Cho | G11C 11/5642 711/103 |
| 2014/0063971 | A1* | 3/2014 | Lee | G11C 16/0483 365/185.22 |
| 2014/0082459 | A1* | 3/2014 | Li | G06F 11/1666 714/773 |
| 2014/0101519 | A1* | 4/2014 | Lee | G06F 11/1068 714/773 |
| 2014/0129903 | A1* | 5/2014 | Yoon | G06F 11/1048 714/764 |
| 2014/0136925 | A1* | 5/2014 | Joo | G06F 11/1048 714/764 |
| 2014/0208187 | A1* | 7/2014 | Rho | G06F 11/1048 714/764 |
| 2015/0135025 | A1* | 5/2015 | Kim | G06F 12/0246 714/704 |
| 2015/0309857 | A1* | 10/2015 | Weilemann, II | G06F 11/073 714/47.3 |
| 2016/0225439 | A1* | 8/2016 | Kim | G11C 11/5621 |
| 2016/0306693 | A1* | 10/2016 | Lin | G06F 11/1048 |
| 2016/0335178 | A1* | 11/2016 | Patel | G06F 12/0246 |
| 2018/0076829 | A1* | 3/2018 | Ueki | H03M 13/1105 |

* cited by examiner

DATA STORAGE DEVICE CAPABLE OF PREVENTING A DATA RETENTION FAIL OF A NONVOLATILE MEMORY DEVICE AND OPERATING METHOD THEREOF

CROSS-REFERENCES TO RELATED APPLICATION

The present application claims priority under 35 U.S.C. § 119(a) to Korean application number 10-2015-0136355, filed on Sep. 25, 2015, in the Korean Intellectual Property Office, which is incorporated herein by reference in its entirety.

BACKGROUND

1. Technical Field

Various embodiments generally relate to a data storage device including a nonvolatile memory device, and, more particularly, to a data storage device and an operating method thereof, capable of preventing a data retention fail of a nonvolatile memory device.

2. Related Art

Recently, the paradigm for the computer environment has been converted into ubiquitous computing so that computer systems can be used anytime and anywhere. Due to this, the use of portable electronic devices, such as mobile phones, digital cameras, and notebook computers has rapidly increased. In general, such portable electronic devices use a data storage device which uses a memory device (also referred to herein simply as a memory device). The data storage device may be used as an auxiliary memory device of the portable electronic devices.

A data storage device using a memory device provides advantages in that, since there is no mechanical driving part, stability and durability are excellent, information access speed is generally high and power consumption is generally small. Data storage devices having such advantages may include a universal serial bus (USB) memory device, memory cards having various interfaces, and a solid state drive (SSD).

As portable electronic devices play large files such as music and video files, the data storage devices are required to have a large storage capacity. The data storage device may use, as a storage medium, a memory device having a high integration degree for its memory cells to secure a large storage capacity, for example, a flash memory device which is a widely used nonvolatile memory device.

SUMMARY

Various embodiments are directed to a data storage device capable of preventing a retention fall of a nonvolatile memory device and an operating method thereof.

In an embodiment, a data storage device may include: a nonvolatile memory device including a plurality of pages; and a control unit suitable for controlling the nonvolatile memory device to perform a read operation to a first page of the nonvolatile memory device according to a read voltage, adjust the read voltage based on a number of error bits in the read-out data according to the read voltage, perform the read operation to the first page according to the adjusted read voltage, and perform a re-program operation to the first page based on a number of on cells as a result of the read operation according to the adjusted read voltage.

In an embodiment, a method for operating a data storage device including a plurality of pages may include: performing a read operation to a first page of the nonvolatile memory device according to a read voltage; adjusting the read voltage based on a number of error bits in the read-out data according to the read voltage; performing the read operation to the first page according to the adjusted read voltage; and performing a re-program operation to the first page based on a number of on cells as a result of the read operation according to the adjusted read voltage.

According to the embodiments, it is possible to prevent a retention fail of a nonvolatile memory device.

DETAILED DESCRIPTION

Various advantages and features of the present invention and methods for achieving them will become more apparent after a reading of the following exemplary embodiments described in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can practice the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "Including," when used in this specification, specify the presence of at least one stated feature, step, operation, and/or element, but do not preclude the presence or addition of one or more other features, steps, operations, and/or elements thereof.

Hereinafter, a data storage device and an operating method thereof will be described below with reference to the accompanying drawings through various examples of embodiments.

Figure 1:
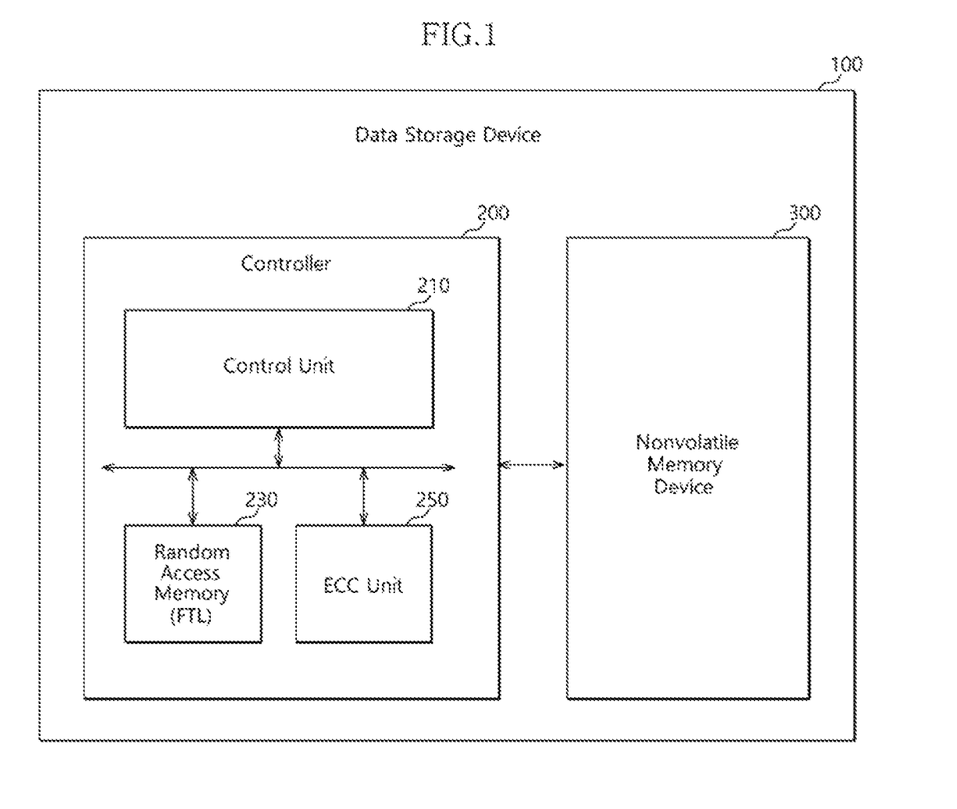
FIG. 1 is a block diagram illustrating a data storage device, according to an embodiment of the invention.

FIG. 1 is a block diagram illustrating a data storage device 100 according to an embodiment. The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may also be referred to as a memory system.

The data storage device 100 may be manufactured as any one of various kinds of storage devices according to the protocol of an interface which is electrically coupled with the host device. For example, the data storage device 100 may be configured as any one of various kinds of storage devices, such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one of various kinds of package types, such as, for example, a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The data storage device 100 may include a nonvolatile memory device 300. The nonvolatile memory device 300 may operate as a storage medium of the data storage device 100. The nonvolatile memory device 300 may be configured by a NAND flash memory device. The nonvolatile memory device 300 may also be configured by any one of various other types of nonvolatile memory devices, such as a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal oxide, according to memory cells which construct a memory cell region.

The data storage device 100 may include a controller 200. The controller 200 may include a control unit 210, a random access memory 230, and an error correction code (ECC) unit 250.

The control unit 210 may control the general operations of the controller 200. The control unit 210 may analyze and process a signal or a request provided from the host device. For example, the control unit 210 may drive a firmware or a software loaded on the random access memory 230. The control unit 210 may be realized in the form of a hardware or in the combined form of a hardware and a software.

The random access memory 230 may store a firmware or a software to be driven by the control unit 210. Also, the random access memory 230 may store data necessary for the driving of the firmware or the software, for example, metadata. That is to say, the random access memory 230 may operate as a working memory of the control unit 210.

The random access memory 230 may temporarily store data to be transmitted between the host device and the nonvolatile memory device 300. In other words, the random access memory 230 may operate as a data buffer memory or a data cache memory.

The error correction code (ECC) unit 250 may perform an error detecting operation for detecting an error in data read out from the nonvolatile memory device 300 and an error correcting operation for correcting the detected error. For example, the error correction code (ECC) unit 250 may generate error correction codes for data to be stored in the nonvolatile memory device 300. The error correction code (ECC) unit 250 may detect the error based on the error correction codes.

When an amount of the detected error is beyond an error-correction capability of the error correction code (ECC) unit 250, the read operation to the data including the error fails.

Figure 2:
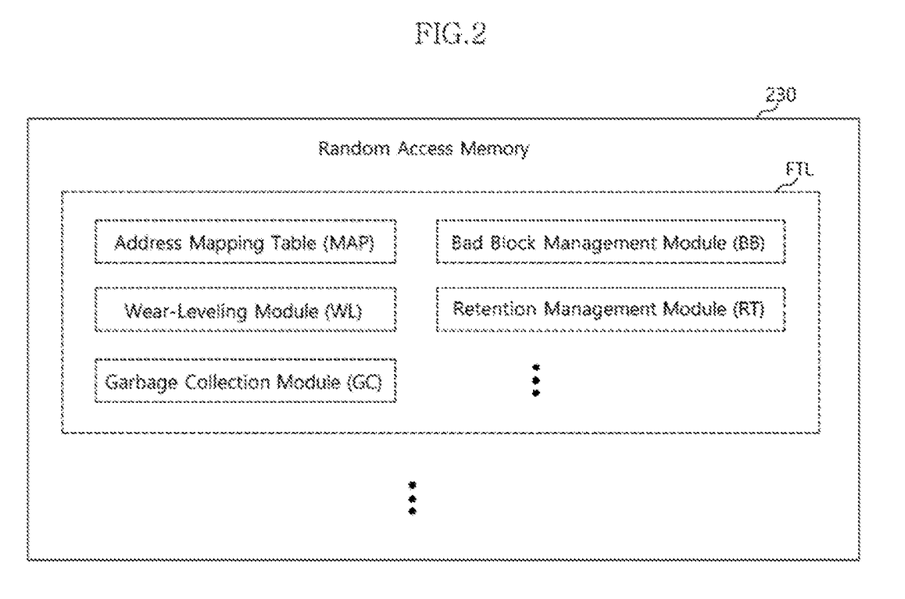
FIG. 2 is a diagram illustrating an example configuration of a random access memory employed in the data storage device shown in FIG. 1.

FIG. 2 is a diagram illustrating an example configuration of a random access memory 230. The random access memory 230 may include at least one of a firmware and a software to be driven in the working memory shown in FIG. 1.

In the case where the nonvolatile memory device 300 is configured by a NAND flash memory device, the control unit 210 may control an erase operation on a memory block unit basis, and a read or program operation on a page unit basis. Further, the control unit 210 may perform in advance an erase operation to memory cells in which new data are to be stored.

The control unit 210 may drive at least one of a firmware and a software referred to as a flash translation layer FTL, to control an operation peculiar to the flash memory device and provide device compatibility to the host device. Through driving of such a flash translation layer FTL, the data storage device 100 may be recognized as a general data storage device such as a hard disk, by the host device.

The flash translation layer FTL loaded on the random access memory 230 may be configured in modules suitable for performing various functions and metadata necessary for driving the modules. For example, referring to FIG. 2, the flash translation layer FTL may include an address mapping table MAP, a wear-leveling module WL, a garbage collection module GC, a bad block management module BB, and a retention management module RT. Other nodules may also be included.

In the case where the host device accesses the data storage device 100, for example, requests a read operation or a write operation, the host device may provide a logical address to the data storage device 100. The flash translation layer FTL may translate the provided logical address into a physical address of the nonvolatile memory device 300, and perform the requested operation by accessing a memory location corresponding to the physical address. For performing such address translation operation, address translation data including the address mapping table MAP may be included in the flash translation layer FTL of the random access memory 230.

The wear-leveling module WL may manage wear levels for memory blocks of the nonvolatile memory device 300. Memory cells of the nonvolatile memory device 300 age according to the number of times they have being used for program and erase operations performed. Aged memory cells may worn-out and may thus cause fails (for example, physical defects). The wear-leveling module WL may manage the program-erase counts of respective memory blocks in such a way as to be leveled more uniformly across the plurality of memory cells, for preventing a certain memory block from being worn out earlier than other memory blocks.

The garbage collection module GC may manage memory blocks where fragmented data are stored. In the case where the nonvolatile memory device 300 is configured by a flash memory device, for which it is not possible to perform an overwrite operation, and a unit of erase (I.e., the memory block) may be larger than a unit of program (i.e., the memory page). For this reason, the nonvolatile memory device 300 may need an operation of collecting valid data dispersed at physically different positions, when a storage space reaches a limit. The garbage collection module GC may perform an operation of collecting multiple valid data, which are fragmented between various memory locations due to performance of a plurality of write/erase operations to a collection area.

The bad block management module BB may manage a memory block in which a fall has occurred, among the memory blocks of the nonvolatile memory device 300. As described above, a fall (for example, a physical defect) may occur in a worn-out memory cell. Data stored in a failed memory cell may not be normally read out. Moreover, data may not be normally stored in a failed memory cell. The bad block management module BB may manage a memory block Including one or more failed memory cells, in such a way as to prevent further use of the one or more failed memory cells.

Memory cells of the nonvolatile memory device 300 may trap charges during the program operation. That is to say, memory cells may be charged when programmed. When a lengthy period passes after the programming of the memory cells or the memory cells are worn out, the programmed memory cells may be discharged despite of the nonvolatile properties of the memory cells, which is referred to as degradation of retention characteristics of the memory cells. Due to the degradation of retention characteristics, reliability of data may not be ensured. Due to the degradation of retention characteristics, data programmed in the memory cells may become corrupted including one or more errors causing a data retention fail. Hence, a data retention fall means the existence of corrupted data stored in memory cells having degraded retention characteristics. The retention management module RT may detect a high likelihood of a retention fail of the memory cells based on the number of error bits included in the data. The retention management module RT may allow the nonvolatile memory device 300 to perform a re-program operation to the memory cells having a high retention fall probability in order to prevent the retention fail.

Figure 3:
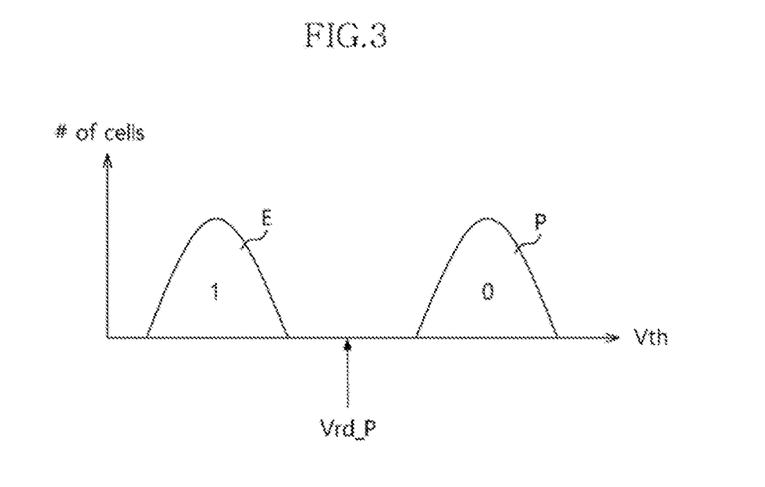
FIGS. 3 and 4 are diagrams illustrating examples of threshold voltage distributions of memory cells included in the nonvolatile memory device employed in the data storage device shown in FIG. 1.
Figure 4:
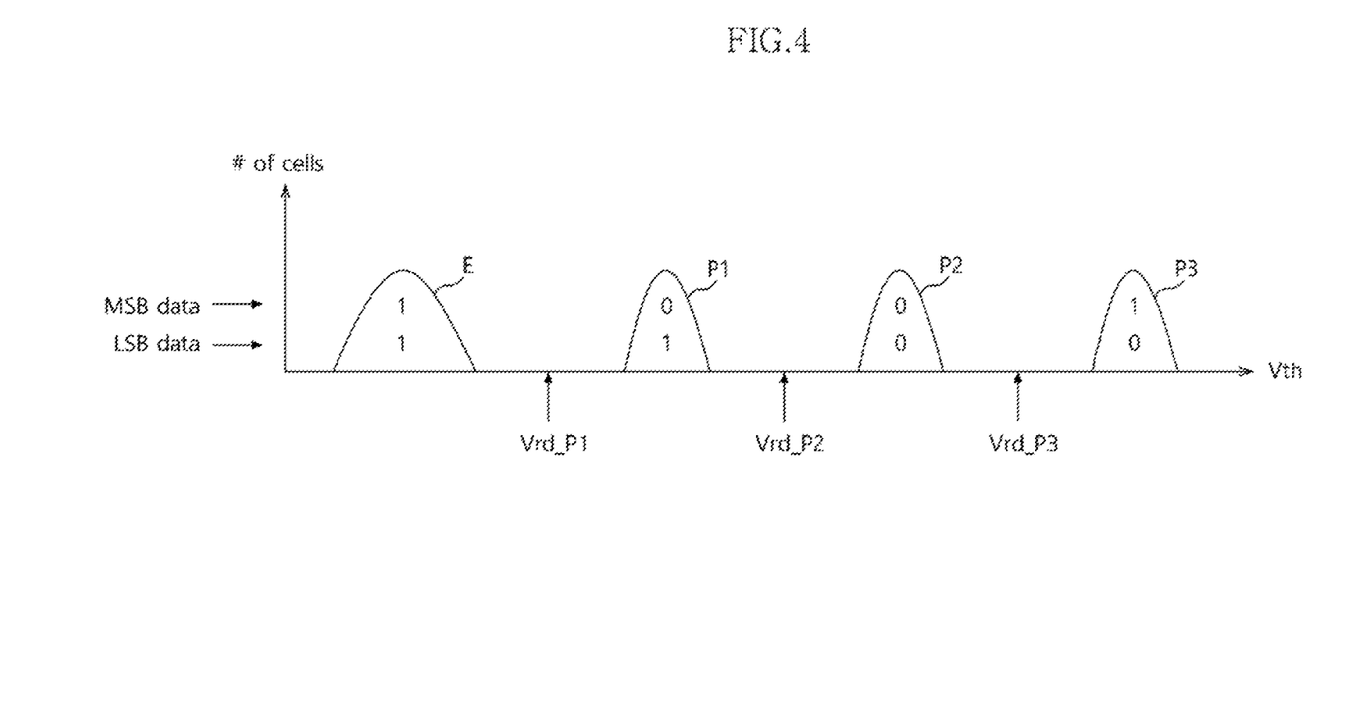

FIGS. 3 and 4 are diagrams illustrating examples of threshold voltage distributions of memory cells included in the nonvolatile memory device shown in FIG. 1.

A memory cell capable of storing a single data bit is referred to as a single level cell (SLC). As shown in FIG. 3, a single level cell (SLC) may be erased to have a threshold voltage of an erase state E, and be programmed to have a threshold voltage of a program state P.

In a read operation, a read voltage Vrd_P having a voltage level between the erase state E and the program state P may be applied to memory cells. If the read voltage Vrd_P is applied, data cells having threshold voltages of the erase state E may be discriminated as on cells which store data "1," and data cells having threshold voltages of the program state P may be discriminated as off cells which store data "0."

A memory cell capable of storing a plurality of data bits (for example, data of 2 or more bits) is referred to as a multilevel cell (MLC). As shown in FIG. 4, a 2-bit multilevel cell (MLC) capable of storing 2-bit data may be erased to have a threshold voltage of an erase state E, and be programmed to have a threshold voltage of any one among a plurality of program states P1, P2 and P3.

In a read operation, any one of a first read voltage Vrd_P1 having a voltage level between the erase state E and a first program state P1, a second read voltage Vrd_P2 having a voltage level between the first program state P1 and a second program state P2, and a third read voltage Vrd_P3 having a voltage level between the second program state P2 and a third program state P3 may be applied to memory cells.

If the second read voltage Vrd_P2 is applied, memory cells having threshold voltages of the erase state E and the first program state P1 may be discriminated as on cells which store LSB data "1," and memory cells having threshold voltages of the second program state P2 and the third program state P3 may be discriminated as off cells which store LSB data "0."

If the first read voltage Vrd_P1 is applied, memory cells having threshold voltages of the erase state E may be discriminated as on cells which store MSB data "1," and memory cells having threshold voltages of the first program state P1 may be discriminated as off cells which store MSB data "0."

If the third read voltage Vrd_P3 is applied, memory cells having threshold voltages of the second program state P2 may be discriminated as on cells which store MSB data "0," and memory cells having threshold voltages of the third program state P3 may be discriminated as off cells which store MSB data "1."

Figure 5:
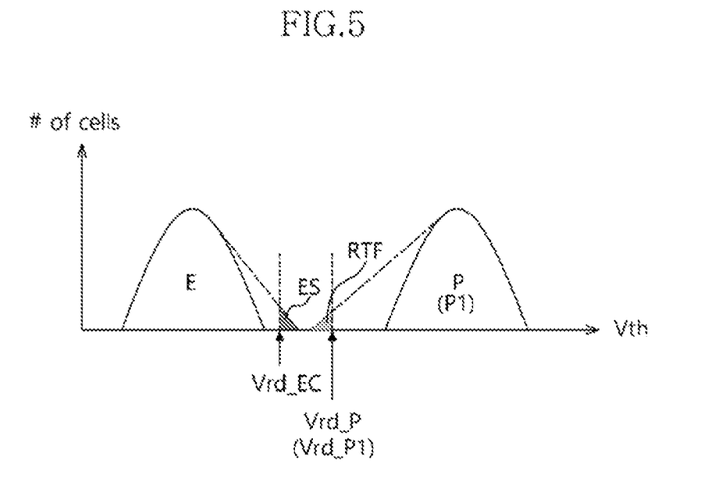
FIG. 5 is a diagram illustrating examples of threshold voltage distributions of memory cells for explaining an operation of a retention management module.

FIG. 5 is a diagram illustrating threshold voltage distributions of memory cells for explaining the operation of the retention management module.

FIG. 5 may exemplarily show the program state P of single level cells SLC and the program state P1 of multilevel cells MLC having threshold voltages most adjacent to the erase state E. The program state P and the program state P1 are the same in that data of programmed memory cells belonging to the program state P and the program state P1 may be erroneously determined to belong to the erase state E due to the retention fall of the data. For the sake of convenience in explanation, the program state P will be described representatively.

Due to the degradation of retention characteristics, threshold voltages of memory cells of the program state P may become lowered. Even though threshold voltages become lowered, memory cells having threshold voltages higher than the read voltage Vrd_P for discriminating the erase state E and the program state P may be correctly determined as the off cells storing data "0". However, memory cells having threshold voltages lower than the read voltage Vrd_P, for example, memory cells having threshold voltages of a retention fail region RTF may be erroneously determined as the on cells storing data "1". That is to say, memory cells, of which threshold voltages become lower than the read voltage Vrd_P although the memory cells are programmed to the program state P, may be determined as on cells storing data "0" due to the retention fail.

The retention management module RT may detect the high likelihood of the retention fail by comparing the number of error bits in read-out data with a reference value. When the retention management module RT detects a high likelihood of the retention fall of the memory cells based on the number of error bits included in data, the retention management module RT may allow the nonvolatile memory device 300 to perform a re-program operation to the memory cells having a high retention fail probability in order to prevent the retention fail.

During the re-program operation for preventing the retention fail, memory cells having threshold voltages of an erase shift region ES may be influenced by program disturbance caused by the re-program operation, and thus threshold voltages thereof may become higher than the read voltage Vrd_P, which also may cause the failure of the read operation. Therefore, prior to the re-programming operation to the memory cells having a high retention fail probability, the retention management module RT may determine whether threshold voltages of the memory cells of the erase state E are likely to be changed due to the re-program operation. In other words, the retention management module RT may determine whether another retention fail is likely to occur due to the re-program operation for preventing a first retention fail.

The retention management module RT may determine whether to perform the re-program operation to the memory cells having a high retention fail probability based on the number of memory cells which are likely to be influenced by program disturbance to be caused by the re-program operation. In order to determine memory cells which are likely to be influenced by program disturbance, the retention management module RT may allow the nonvolatile memory device 300 to adjust a read voltage to an erase state verify voltage Vrd_EC lower than the original read voltage Vrd_P and read out data by applying the adjusted read voltage Vrd_EC. The retention management module RT may determine whether to perform the re-program operation for preventing the retention fall by comparing the number of data bits corresponding to on cells (that is, the number of memory cells having threshold voltages lower than the adjusted read voltage Vrd_EC) with a reference value.

Figure 6:
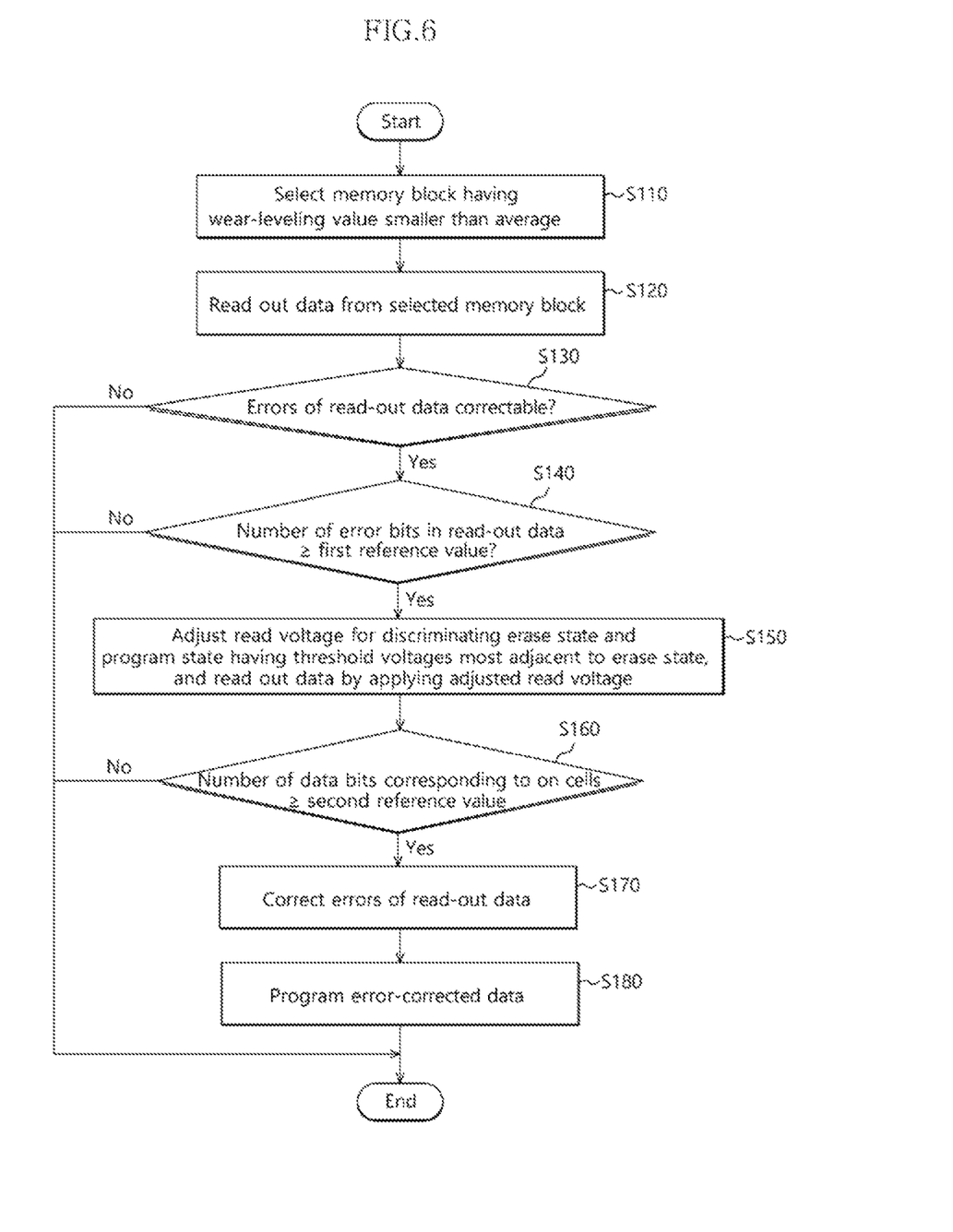
FIG. 6 is a flow chart Illustrating the operation of the retention management module, according to an embodiment of the invention.

FIG. 6 is a flow chart of an operation of the retention management module RT according to an embodiment of the invention.

Accordingly, FIG. 6 shows an operation of the control unit 210 driving the various modules described above with reference to FIG. 2, and the nonvolatile memory device 300 which operates according to control of the control unit 210.

At step S110, the control unit 210 may select a memory block which has a wear-leveling value smaller than an average value. When a lengthy period passes after the programming of the memory cells or the memory cells are worn out in a memory block, the memory block may have a wear-leveling value that is smaller than an average value. Therefore, the memory block having a wear-leveling value smaller than an average value or a program-erase count that is smaller than the average value may be highly likely to be degraded in the retention characteristic and thus highly likely to have the retention fail.

At step S120, the control unit 210 may read out data from the selected memory block. As mentioned above, since the read operation is performed to the nonvolatile memory device 300 by the unit of a page, the control unit 210 may read out data from memory cells of a first page among pages of the selected memory block.

At step S130, the control unit 210 may control the ECC unit 250 to determine whether the amount of errors in read-out data is correctable or within the error-correction capability of the error correction code (ECC) unit 250 based on a result of the ECC decoding operation performed by the ECC unit 250.

When the amount of the detected error is determined to be uncorrectable, i.e., beyond the error-correction capability of the ECC unit 250, the control unit 210 may not end the process. The read operation to the data from the selected memory block may fail. When the amount of the detected error is determined to be correctable or within the error-correction capability of the ECC unit 250, the process may proceed to step S140.

At step S140, the control unit 210 may determine whether the number of error bits of the read-out data is equal to or larger than a first reference value. When the number of error bits of the read-out data is smaller than the first reference value, the read operation to the data from the selected memory block may succeed despite of the degradation of retention characteristics, as described with reference to FIG. 5. Accordingly, the process may be ended.

In the case where the number of error bits of the read-out data is equal to or larger than the first reference value, the selected memory block may be highly likely to have a retention fall and thus the process may proceed to step S150 in order to prevent the highly likely retention fall.

At step S150, the control unit 210 may adjust the read voltage for discriminating the erase state E and the program state P or P1 most adjacent to the erase state E, and read out data from the selected page of the selected memory block by applying the adjusted read voltage to the memory cells. As exemplified with reference to FIG. 5, the retention management module RT may allow the nonvolatile memory device 300 to adjust the read voltage to the erase state verify voltage Vrd_EC lower than the original read voltage Vrd_P and read out data from the selected memory block by applying the adjusted read voltage Vrd_EC. The control unit 210 may control the nonvolatile memory device 300 to adjust the read voltage and to read out data from the selected page of the selected memory block according to the adjusted read voltage.

As a result of the read operation of step S150, memory cells whose threshold voltages are lower than the adjusted read voltage may be determined as on cells storing data "0" or having the threshold voltages of the erase state E. On the other hand, memory cells whose threshold voltages are higher than the adjusted read voltage may be determined as off cells storing data "1" or having the threshold voltages of the program state P or P1.

At step S160, the control unit 210 may determine whether the number of data bits corresponding to the on cells is equal to or larger than a second reference value. At step 160, the control unit 210 may determine whether threshold voltages of the memory cells of the erase state E are likely to be changed or whether another retention fail is likely to occur due to the re-program operation for preventing the retention fail, as described with reference to FIG. 5. As described above, the control unit 210 may determine whether to perform the re-program operation to the memory cells having a high retention fail probability based on the number of memory cells which are likely to be influenced by the program disturbance to be caused by the re-program operation.

When the number of data bits corresponding to the on cells is smaller than the second reference voltage, threshold voltages of the memory cells of the erase state E may be likely to be changed or another retention fail may be likely to occur due to the re-program operation for preventing the retention fail. Accordingly, the process may be ended. In the case where the number of data bits corresponding to on cells is equal to or larger than the second reference value, threshold voltages of the memory cells of the erase state E may not be likely to be changed or another retention fall may not be likely to occur due to the re-program operation for preventing the retention fail. Accordingly, the process may proceed to step S170.

At step S170, the control unit 210 may control the ECC unit 250 to correct the error of the data read out from the selected memory block at step S120.

At step S180, the control unit 210 may perform the re-program operation by programming the error-corrected data. For instance, the control unit 210 may perform the re-program operation by programming the error-corrected data into the memory cells of the first page selected at step S120. In this case, the control unit 210 may control the nonvolatile memory device 300 so that a program voltage is applied at least one time to the memory cells of the first page, based on the error-corrected data. For another instance, the control unit 210 may perform the re-program operation by programming the error-corrected data into memory cells of a second page other than the first page. The second page may be included in the selected memory block or another memory block other than the selected memory block.

Figure 7:
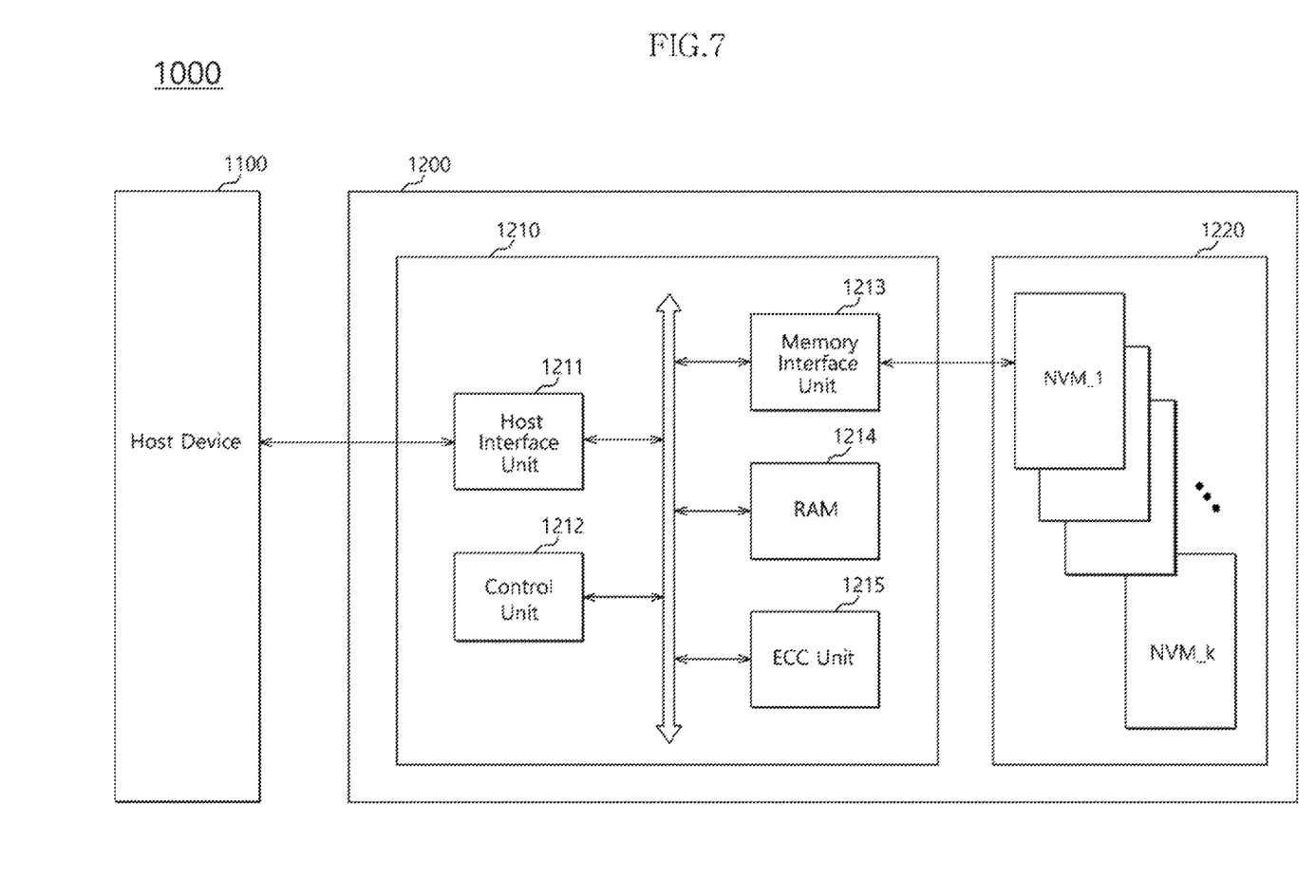
FIG. 7 is a block diagram Illustrating a data processing system including a data storage device, according to an embodiment of the invention.

FIG. 7 is a block diagram illustrating a data processing system including a data storage device, according to an embodiment of the present Invention.

A data processing system 1000 may include a host device 1100 and a data storage device 1200. The data storage device 1200 may include a controller 1210 and a nonvolatile memory device 1220. The data storage device 1200 may be used by being coupled to the host device 1100, such as a mobile phone, an MP3 player, a laptop computer, a desktop computer, a game player, a TV, an in-vehicle infotainment system, and the like.

The controller 1210 may include a host Interface unit 1211, a control unit 1212, a memory interface unit 1213, a random access memory 1214, and an error correction code (ECC) unit 1215.

The control unit 1212 may control general operations of the controller 1210 in response to a request from the host device 1100. The control unit 1212 may drive a firmware or a software for controlling the nonvolatile memory device 1220. The control unit 1212 may perform the retention fall management operation described above with reference to FIG. 6.

The random access memory 1214 may be used as a working memory of the control unit 1212. The random access memory 1214 may be used as a buffer memory which temporarily stores data read out from the nonvolatile memory device 1220 or data provided from the host device 1100.

The host interface unit 1211 may interface the host device 1100 and the controller 1210. For example, the host interface unit 1211 may communicate with the host device 1100 through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system Interface (SCSI) protocol, a serial attached SCSI (SAS) protocol and the like.

The memory interface unit 1213 may interface the controller 1210 and the nonvolatile memory device 1220. The memory interface unit 1213 may provide commands and addresses to the nonvolatile memory device 1220. Furthermore, the memory interface unit 1213 may exchange data with the nonvolatile memory device 1220.

The error correction code (ECC) unit 1215 may detect an error in the data read out from the nonvolatile memory device 1220. Also, the error correction code (ECC) unit 1215 may correct a detected error when the detected error is within a correctable range.

The nonvolatile memory device 1220 may be used as the storage medium of the data storage device 1200. The nonvolatile memory device 1220 may include a plurality of nonvolatile memory chips (or dies) NVM_1 to NVM_k.

The controller 1210 and the nonvolatile memory device 1220 may be manufactured as any one of various data storage devices. For example, the controller 1210 and the nonvolatile memory device 1220 may be integrated into a one semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a Personal Computer Memory Card International Association (PCMCIA) card, a compact flash (CF) card, a smart media card, a memory stick, and the like.

Figure 8:
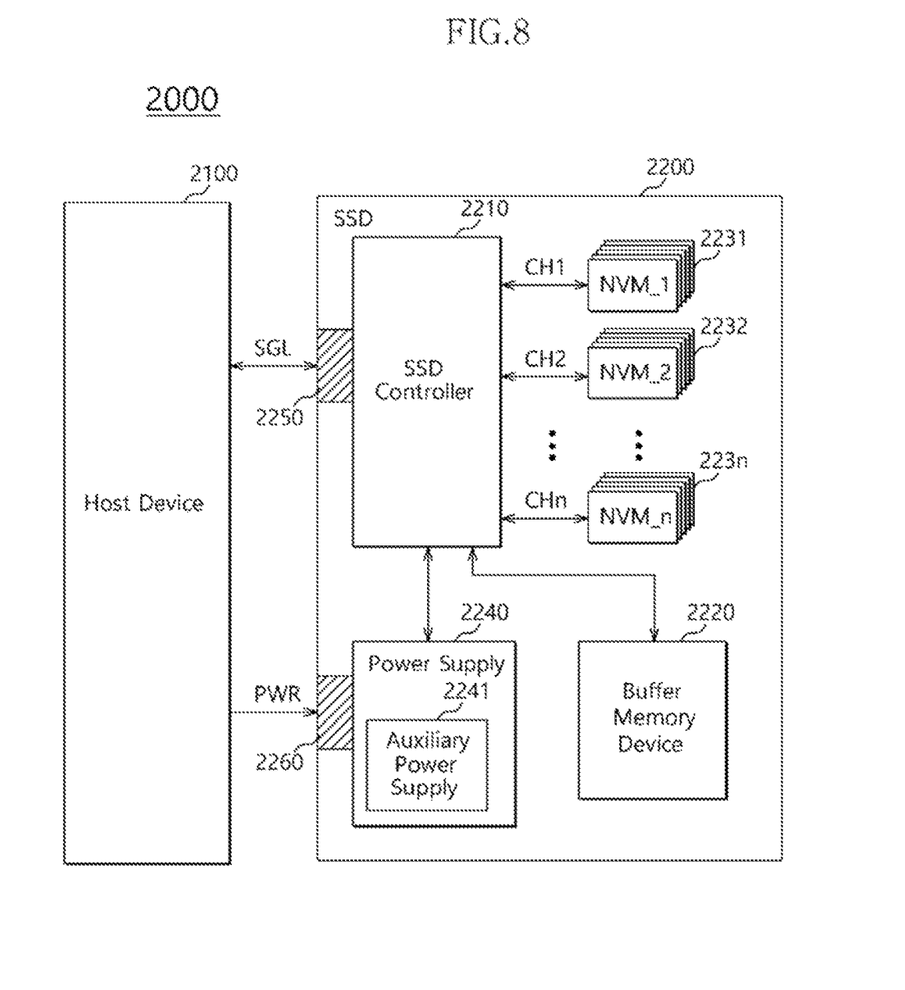
FIG. 8 is a block diagram illustrating a data processing system including a solid state drive (SSD), according to an embodiment of the invention.

FIG. 8 is a block diagram illustrating a data processing system including a solid state drive (SSD), according to an embodiment of the invention.

A data processing system 2000 may include a host device 2100 and a solid state drive (SSD) 2200.

The SSD 2200 may include an SSD controller 2210, a buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100.

The buffer memory device 2220 may temporarily store data which are to be stored in the nonvolatile memory devices 2231 to 223n. Further, the buffer memory device 2220 may temporarily store data which are read out from the nonvolatile memory devices 2231 to 223n. The data temporarily stored in the buffer memory device 2220 may be transmitted to the host device 2100 or the nonvolatile memory devices 2231 to 223n under the control of the SSD controller 2210.

The nonvolatile memory devices 2231 to 223n may be used as storage media of the SSD 2200. The nonvolatile memory devices 2231 to 223n may be coupled with the SSD controller 2210 through a plurality of channels CH1 to CHn, respectively. One or more nonvolatile memory devices may be coupled to one channel. The nonvolatile memory devices coupled to one channel may be coupled to the same signal bus and data bus.

The power supply 2240 may provide power PWR inputted through the power connector 2260, to the inside of the SSD 2200. The power supply 2240 may include an auxiliary power supply 2241. The auxiliary power supply 2241 may supply power so as to allow the SSD 2200 to be normally terminated when a sudden power-off occurs. The auxiliary power supply 2241 may, for example, include super capacitors capable of charging power PWR.

The SSD controller 2210 may exchange a signal SGL with the host device 2100 through the signal connector 2250. The signal SGL may include a command, an address, data, and so forth. The signal connector 2250 may by configured by a connector, such as of parallel advanced technology attachment (PATA), serial advanced technology attachment (SATA), small computer system interface (SCSI), serial attached SCSI (SAS), peripheral component interconnection (PCI) and PCI express (PCI-E) protocols, according to an interface scheme between the host device 2100 and the SSD 2200.

Figure 9:
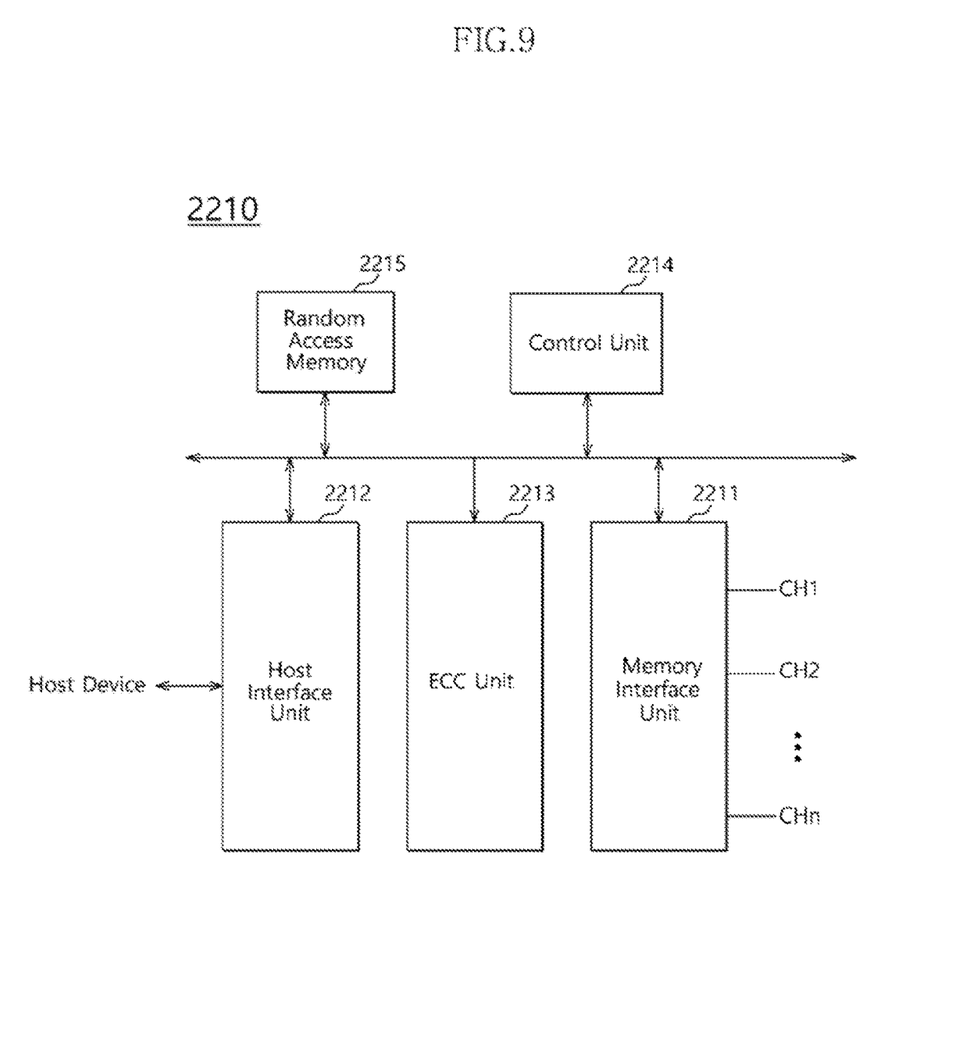
FIG. 9 is a block diagram illustrating an example of a SSD controller employed in the data processing system shown in FIG. 8.

FIG. 9 is a block diagram Illustrating an example of the SSD controller shown in FIG. 8. Referring to FIG. 9, the SSD controller 2210 may include a memory interface unit 2211, a host interface unit 2212, an error correction code (ECC) unit 2213, a control unit 2214, and a random access memory 2215.

The memory interface unit 2211 may provide control signals, such as commands and addresses to the nonvolatile memory devices 2231 to 223n. Moreover, the memory interface unit 2211 may exchange data with the nonvolatile memory devices 2231 to 223n. The memory interface unit 2211 may direct data transmitted from the buffer memory device 2220 to the respective channels CH1 to CHn, under control of the control unit 2214. Furthermore, the memory interface unit 2211 may transmit data read out from the nonvolatile memory devices 2231 to 223n to the buffer memory device 2220, under control of the control unit 2214.

The host interface unit 2212 may provide an interface with the SSD 2200 in correspondence to a protocol of the host device 2100. For example, the host interface unit 2212 may communicate with the host device 2100 through one of a parallel advanced technology attachment (PATA), serial advanced technology attachment (SATA), small computer system interface (SCSI), serial attached SCSI (SAS), peripheral component interconnection (PCI), PCI express (PCI-E) protocol and the like. In addition, the host interface unit 2212 may perform a disk emulating function of supporting the host device 2100 to recognize the SSD 2200 as a hard disk drive (HDD).

The ECC unit 2213 may generate parity data based on data to be transmitted to the nonvolatile memory devices 2231 to 223n. The generated parity data may be stored, along with data, in the nonvolatile memory devices 2231 to 223n. The ECC unit 2213 may detect an error of data read out from the nonvolatile memory devices 2231 to 223n. When a detected error is within a correctable range, the ECC unit 2213 may correct the detected error.

The control unit 2214 may analyze and process the signal SGL inputted from the host device 2100. The control unit 2214 may control operations of the buffer memory device 2220 and the nonvolatile memory devices 2231 to 223n according to a firmware or a software for driving the SSD 2200. The control unit 2214 may perform the retention fail management operation described above with reference to FIG. 6.

The random access memory 2215 may be used as a working memory for driving the firmware or the software.

Figure 10:
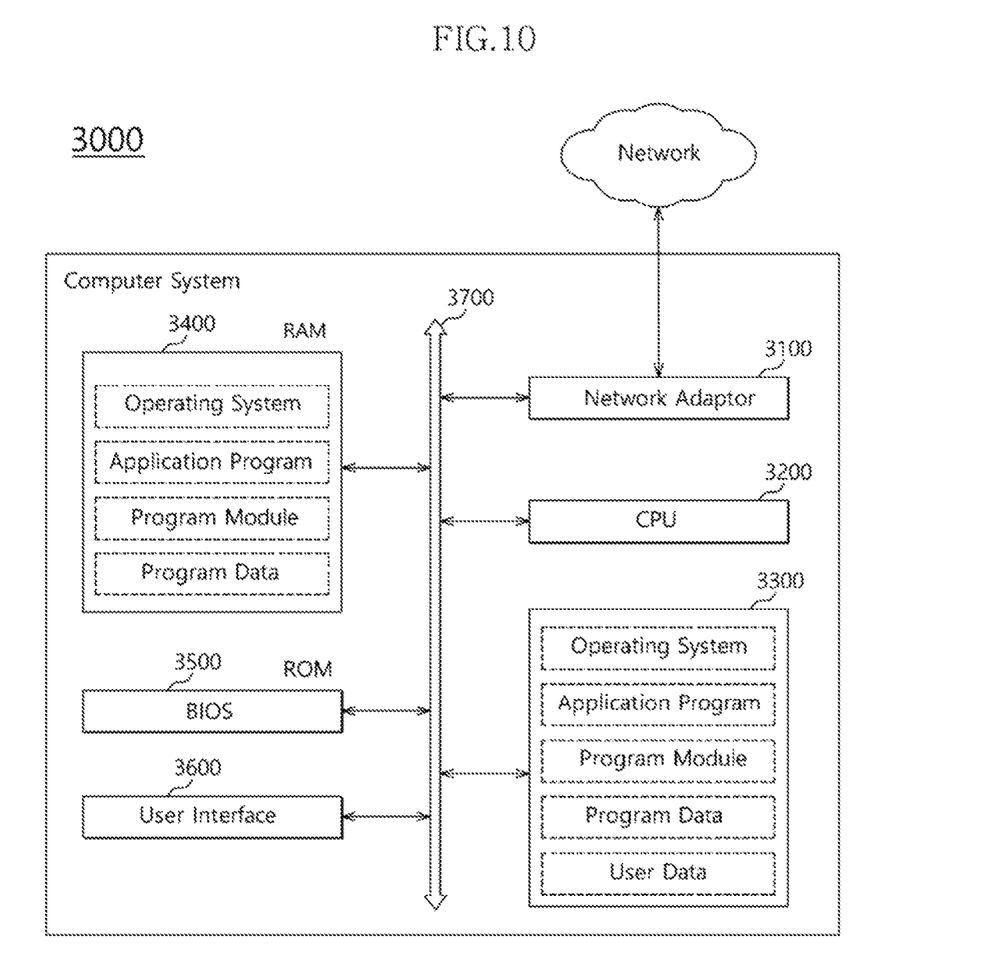
FIG. 10 is a block diagram illustrating a computer system including a data storage device, according to an embodiment of the invention.

FIG. 10 is a block diagram illustrating a computer system including a data storage device according to an embodiment of the Invention. Referring to FIG. 10, a computer system 3000 may include a network adaptor 3100, a central processing unit 3200, a data storage device 3300, a RAM 3400, a ROM 3500 and a user interface 3600, which are electrically coupled to a system bus 3700. The data storage device 3300 may be configured by the data storage device 100 shown in FIG. 1, the data storage device 1200 shown in FIG. 7 or the SSD 2200 shown in FIG. 8.

The network adaptor 3100 may provide interfacing between the computer system 3000 and external networks. The central processing unit 3200 may perform general calculation processing for driving an operating system residing at the RAM 3400 or an application program.

The data storage device 3300 may store general data needed in the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data needed for driving programs, which are read out from the data storage device 3300, may be loaded on the RAM 3400. A BIOS (basic input/output system) which is enabled before the operating system is driven may be stored in the ROM 3500. Information exchange between the computer system 3000 and a user may be implemented through the user interface 3600.

Figure 11:
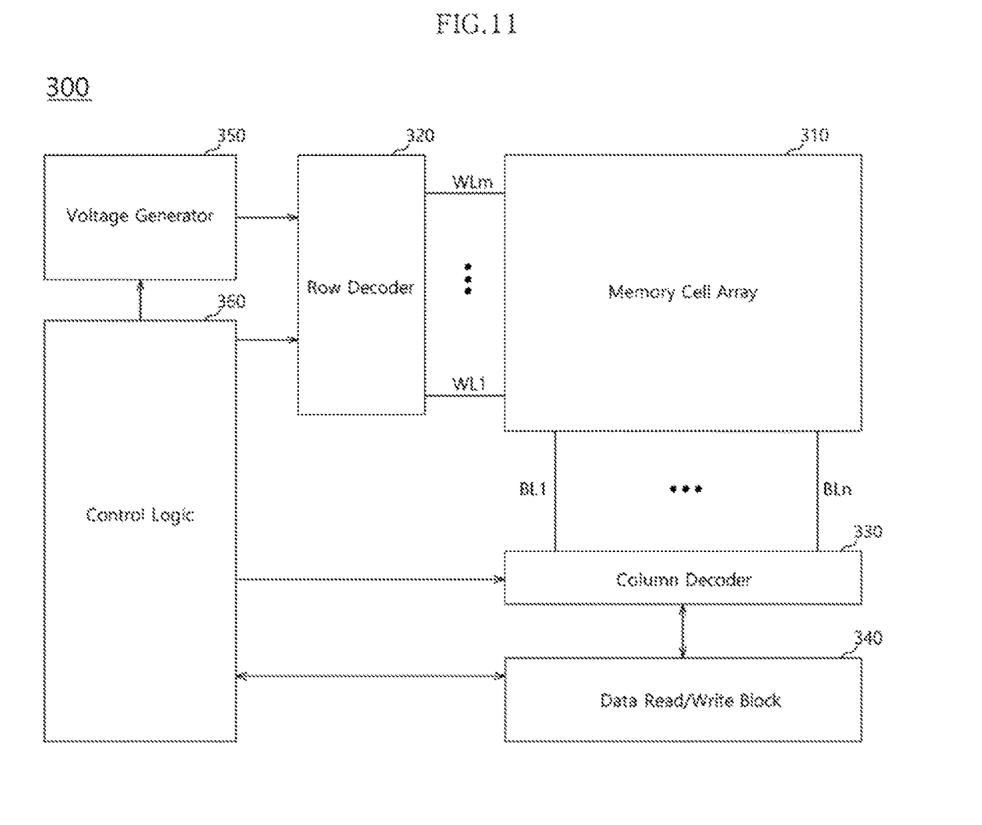
FIG. 11 is a block diagram Illustrating a nonvolatile memory device included in a data storage device, according to an embodiment of the invention.

FIG. 11 is a block diagram illustrating the nonvolatile memory device included in the data storage device according to the embodiment. Referring to FIG. 11, a nonvolatile memory device 300 may include a memory cell array 310, a row decoder 320, a column decoder 330, a data read/write block 340, a voltage generator 350, and a control logic 360.

The memory cell array 310 may include memory cells which are arranged at areas where word lines WL1 to WLm and bit lines BL1 to BLn intersect with each other. The memory cells may be grouped by an access unit, such as a memory block as an erase unit and a page as a program and read unit.

The row decoder 320 may be coupled with the memory cell array 310 through the word lines WL1 to WLm. The row decoder 320 may operate according to control of the control logic 360. The row decoder 320 may decode addresses provided from an external device (not shown). The row decoder 320 may select and drive the word lines WL1 to WLm, based on decoding results. For instance, the row decoder 320 may provide word line voltages provided from the voltage generator 350, to the word lines WL1 to WLm.

The column decoder 330 may be coupled with the memory cell array 310 through the bit lines BL1 to BLn. The column decoder 330 may operate according to control of the control logic 360. The column decoder 330 may decode addresses provided from the external device. The column decoder 330 may couple the bit lines BL1 to BLn with read/write circuits of the data read/write block 340 which respectively correspond to the bit lines BL1 to BLn, based on decoding results. Also, the column decoder 330 may drive the bit lines BL1 to BLn, based on the decoding results.

The data read/write block 340 may operate according to control of the control logic 360. The data read/write block 340 may operate as a write driver or a sense amplifier according to an operation mode. For example, the data read/write block 340 may operate as a write driver which stores data provided from the external device, in the memory cell array 310 in a write operation. For another example, the data read/write block 340 may operate as a sense amplifier which reads out data from the memory cell array 310 in a read operation.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control the general operations of the nonvolatile memory device 300, based on control signals provided from the external device (for example, a control unit). For example, the control logic 360 may control operations of the nonvolatile memory device 300, such as read, write, and erase operations of the nonvolatile memory device 300. If a special command for adjusting a read voltage and for reading out memory cells by using an adjusted read voltage is provided from the external device, the control logic 360 may perform a read operation according to such a special command.

While various embodiments have been described above, it will be understood to those skilled in the art that the embodiments described are examples only. Accordingly, the data storage device and the operating method thereof described herein should not be limited based on the described embodiments. It will be apparent to those skilled in the relevant art that various changes and modifications may be made without departing from the spirit and or scope of the invention as defined in the following claims.

What is claimed is:

1. A data storage device comprising:
a nonvolatile memory device including a plurality of pages; and
a control unit suitable for:
selecting a first page for determining a retention fail among pages of a memory block which has a wear-leveling value smaller than an average,
controlling the nonvolatile memory device for performing a first read operation to the first page of the nonvolatile memory device according to a read voltage,
adjusting the read voltage based on a number of error bits in read-out data according to the read voltage when the retention fail is determined to occur in the first page,
performing a second read operation to the first page according to the adjusted read voltage to determine whether another retention fail is likely to occur in a re-program operation, and
performing the re-program operation to the first page based on a number of on cells as a result of the second read operation according to the adjusted read voltage.

2. The data storage device according to claim 1, wherein the control unit controls the nonvolatile memory device to adjust the read voltage when the number of the error bits of the read-out data is equal to or larger than a first reference value.

3. The data storage device according to claim 1, wherein the control unit controls the nonvolatile memory device to perform the re-program operation to the first page when the number of on cells is equal to or larger than a second reference value.

4. The data storage device according to claim 1, wherein the control unit controls the nonvolatile memory device to perform the re-program operation by performing an error correction operation to the read-out data according to the read voltage and a program operation to error-corrected data.

5. The data storage device according to claim 4, wherein the control unit controls the nonvolatile memory device to perform the program operation to the error-corrected data by programming the error-corrected data into the first page.

6. The data storage device according to claim 4, wherein the control unit controls the nonvolatile memory device to perform the program operation to the error-corrected data by programming the error-corrected data into a second page.

7. The data storage device according to claim 1, wherein the control unit controls the nonvolatile memory device to skip the re-program operation to the first page when the number of on cells is smaller than a second reference value.

8. The data storage device according to claim 1, wherein the control unit controls the nonvolatile memory device to adjust the read voltage when the number of the error bits of the read-out data is equal to or larger than a first reference value and the error bits are correctable.

9. A method for operating a data storage device including a plurality of pages, the method comprising:
selecting a first page for determining a retention fail among pages of a memory block which has a wear-leveling value smaller than an average;
performing a first read operation to the first page of the nonvolatile memory device according to a read voltage;
adjusting the read voltage based on a number of error bits in read-out data according to the read voltage when the retention fail is determined to occur in the first page;
performing a second read operation to the first page according to the adjusted read voltage to determine whether another retention fail is likely to occur in a re-program operation; and
performing the re-program operation to the first page based on a number of on cells as a result of the second read operation according to the adjusted read voltage.

10. The method according to claim 9, wherein the adjusting of the read voltage is performed when the number of the error bits of the read-out data is equal to or larger than a first reference value.

11. The method according to claim 9, wherein the re-program operation to the first page is performed when the number of on cells is equal to or larger than a second reference value.

12. The method according to claim 9, wherein the performing of the re-program operation includes performing an error correction operation to the read-out data according to the read voltage and a program operation to error-corrected data.

13. The method according to claim 12, wherein the performing of the program operation to the error-corrected data includes programming the error-corrected data into the first page.

14. The method according to claim 12, wherein the performing of the program operation to the error-corrected data includes programming the error-corrected data into a second page.

15. The method according to claim 9, wherein the performing of the re-program operation to the first page includes skipping the re-program operation to the first page when the number of on cells is smaller than a second reference value.

16. The method according to claim 9, wherein the adjusting of the read voltage is performed when the number of the error bits of the read-out data is equal to or larger than a first reference value and the error bits are correctable.

* * * * *